United States Patent
Liang et al.

(10) Patent No.: US 7,510,624 B2
(45) Date of Patent: Mar. 31, 2009

(54) SELF-COOLING GAS DELIVERY APPARATUS UNDER HIGH VACUUM FOR HIGH DENSITY PLASMA APPLICATIONS

(75) Inventors: Qiwei Liang, Fremont, CA (US); Siqing Lu, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 200 days.

(21) Appl. No.: 11/016,166

(22) Filed: Dec. 17, 2004

(65) Prior Publication Data

US 2006/0130756 A1    Jun. 22, 2006

(51) Int. Cl.
*H01L 21/306* (2006.01)
*C23C 16/455* (2006.01)
*C23C 16/00* (2006.01)

(52) U.S. Cl. .................................. 156/345.33; 118/715

(58) Field of Classification Search ................. 118/715; 156/345.29, 345.33
See application file for complete search history.

(56) References Cited

U.S. PATENT DOCUMENTS

| | | | |
|---|---|---|---|
| 4,439,401 A | 3/1984 | Voll et al. | |
| 5,322,567 A | 6/1994 | Deaton et al. | |
| 5,441,568 A | 8/1995 | Cho et al. | |
| 5,772,771 A | 6/1998 | Li et al. | |
| 5,804,259 A | 9/1998 | Robles | |
| 5,851,294 A * | 12/1998 | Young et al. ................. | 118/715 |
| 5,865,896 A | 2/1999 | Nowak et al. | |
| 5,994,662 A | 11/1999 | Murugesh | |
| 6,013,155 A * | 1/2000 | McMillin et al. ....... | 156/345.33 |
| 6,070,551 A | 6/2000 | Li et al. | |
| 6,083,344 A * | 7/2000 | Hanawa et al. ......... | 156/345.28 |
| 6,143,078 A * | 11/2000 | Ishikawa et al. ............ | 118/715 |
| 6,170,428 B1 | 1/2001 | Redeker et al. | |
| 6,302,965 B1 | 10/2001 | Umotoy et al. | |
| 6,383,964 B1 | 5/2002 | Nakahara et al. | |
| 6,416,823 B2 | 7/2002 | Li et al. | |
| 6,450,117 B1 | 9/2002 | Murugesh et al. | |
| 6,453,992 B1 | 9/2002 | Kim | |
| 6,589,610 B2 | 7/2003 | Li et al. | |
| 6,737,812 B2 | 5/2004 | Yuasa et al. | |
| 6,786,973 B2 | 9/2004 | Strauch et al. | |
| 6,821,910 B2 | 11/2004 | Adomaitis et al. | |

(Continued)

FOREIGN PATENT DOCUMENTS

EP    7023.92 A    3/1996

(Continued)

*Primary Examiner*—Jeffrie R Lund
(74) *Attorney, Agent, or Firm*—Townsend & Townsend and Crew (57) ABSTRACT

A gas distributor for use in a semiconductor processing chamber is provided. The gas distributor comprises a gas inlet, a gas outlet, and a stem section having a spiral thread. The gas distributor further comprises a body having a gas deflecting surface that extends radially outward away from the stem section and a lower face disposed on the opposite side of the body from the gas deflecting surface, a lateral seat disposed between the spiral thread and the gas deflecting surface, and a gas passageway that extends from the gas inlet through the stem section and body to the gas outlet. In a specific embodiment, the lateral seat is adapted to hold a sealing member.

17 Claims, 7 Drawing Sheets

U.S. PATENT DOCUMENTS

| | | |
|---|---|---|
| 7,294,207 B2 | 11/2007 | Strauch et al. |
| 2002/0039625 A1 | 4/2002 | Powell et al. |
| 2003/0177977 A1 | 9/2003 | Strauch et al. |
| 2004/0060514 A1 | 4/2004 | Janakiramen et al. |
| 2004/0126952 A1 | 7/2004 | Gondhalekar et al. |
| 2004/0231798 A1* | 11/2004 | Gondhalekar et al. .. 156/345.33 |
| 2005/0000441 A1 | 1/2005 | Kaeppeler et al. |
| 2005/0218115 A1* | 10/2005 | Lei et al. ...................... 216/59 |
| 2006/0048707 A1* | 3/2006 | Lei et al. .................... 118/715 |
| 2006/0075967 A1* | 4/2006 | Lu et al. ................... 118/723 I |
| 2006/0130756 A1* | 6/2006 | Liang et al. ................ 118/715 |
| 2006/0196420 A1 | 9/2006 | Ushakov et al. |
| 2006/0196603 A1 | 9/2006 | Lei et al. |
| 2008/0121177 A1* | 5/2008 | Bang et al. ................. 118/723 I |
| 2008/0121178 A1* | 5/2008 | Bang et al. ................. 118/723 I |
| 2008/0121179 A1* | 5/2008 | Park et al. ............... 118/723 R |
| 2008/0124944 A1* | 5/2008 | Park et al. .................... 438/778 |
| 2008/0185284 A1* | 8/2008 | Chen et al. ................... 204/164 |
| 2008/0188087 A1* | 8/2008 | Chen et al. ................... 438/758 |
| 2008/0188090 A1* | 8/2008 | Chen et al. ................... 438/778 |

FOREIGN PATENT DOCUMENTS

| | | |
|---|---|---|
| JP | 55-166926 A | 12/1980 |
| JP | 2006-310481 A | 11/2006 |
| JP | 2007-305890 A | 11/2007 |

* cited by examiner

SELF-COOLING GAS DELIVERY APPARATUS UNDER HIGH VACUUM FOR HIGH DENSITY PLASMA APPLICATIONS

BACKGROUND OF THE INVENTION

This present invention relates generally to semiconductor manufacturing equipment. More specifically, the present invention relates to temperature control of semiconductor manufacturing equipment. Merely by way of example, the invention has been applied to a self-cooling gas delivery apparatus used with a high density plasma processing chamber. The method and apparatus can be applied to other applications as well such as self-cooling of gas delivery nozzles and the like.

Chemical vapor deposition (CVD) is a gas reaction process used in the semiconductor industry to form thin layers or films of desired materials on a substrate. Some high density plasma (HDP) enhanced CVD processes use a reactive chemical gas along with physical ion generation through the use of an RF-generated plasma to enhance the film deposition by attraction of the positively charged plasma ions onto a negatively biased substrate surface at angles near the vertical to the surface, or at preferred angles to the surface by directional biasing of the substrate surface. One goal in the fabrication of integrated circuits (ICs) is to form very thin, yet uniform films onto substrates, at a high throughput.

Gas nozzles are used in many CVD chambers as part of the gas delivery system. for example, process gases used in the thin film deposition process enter the chamber through one or more gas nozzles disposed on interior surfaces of the chamber. The gas nozzles are made of a variety of materials, including ceramics. Depending on the chamber design, some CVD processes, and particularly plasma assisted CVD processes operates at high temperatures and subject the gas nozzles to plasma heating inside the chamber. These nozzles, which are typically ceramic nozzles with one or more orifices located at the distal end, can reach temperatures as high as about 800° C. or higher during typical HPD CVD processes. These high temperatures may result in the premature dissociation of process gases inside the nozzle, rather than near the substrate, resulting in the creation of reaction byproducts that are subsequently incorporated into the film. These undesired processes may cause non-uniformities and particles in the deposition process along with other problems.

Therefore, there is a need in the art for a self-cooling gas delivery apparatus for use in HDP-CVD and other semiconductor processing apparatus.

SUMMARY OF THE INVENTION

This present invention relates generally to semiconductor manufacturing equipment. More specifically, the present invention relates to temperature control of semiconductor manufacturing equipment. Merely by way of example, the invention has been applied to a self-cooling gas delivery apparatus used with a high density plasma processing chamber. The method and apparatus can be applied to other applications as well such as self-cooling of gas delivery nozzles and the like.

In one embodiment of the present invention, a gas distributor is provided for use in a semiconductor processing chamber. The gas distributor includes a gas inlet and a gas outlet. The gas distributor also includes a stem section having a spiral thread and a body having a gas deflecting surface that extends radially outward away from the stem section and a lower face disposed on the opposite side of the body from the gas deflecting surface. Further, the gas distributor includes a lateral seat disposed between the spiral thread and the gas deflecting surface and a gas passageway that extends from the gas inlet through the stem section and body to the gas outlet. In a specific embodiment according to the present invention, the lateral seat is adapted to hold a sealing member, which in a particular embodiment is an O-ring.

In another embodiment of the present invention, a substrate processing system includes a processing chamber having an interior upper surface that includes a centered circular opening, a substrate support member disposed in the processing chamber, and a gas distributor that extends through the circular opening in the upper surface of the chamber towards the substrate support member. The gas distributor includes a gas inlet, a gas outlet, a stem section having a spiral thread, a body having a gas deflecting surface that extends radially outward away from the stem section and a lower face disposed on the opposite side of the body from the gas deflecting surface. The gas distributor also includes a lateral seat disposed between the spiral thread and the gas deflecting surface and a gas passageway that extends from the gas inlet through the stem section and body to the gas outlet. The substrate processing system further includes a gas exit circumscribing the gas distributor. In a specific embodiment, the substrate processing system further includes a gas delivery block overlying the centered circular opening of the upper surface of the chamber, the gas delivery block comprising a spiral thread that is threadably coupled to the spiral thread of the stem section of the gas distributor.

DESCRIPTION OF SPECIFIC EMBODIMENTS

This present invention relates generally to semiconductor manufacturing equipment. More specifically, the present invention provides for temperature control of semiconductor manufacturing equipment. Merely by way of example, the invention has been applied to a self-cooling gas delivery apparatus used with a high density plasma processing chamber. The method and apparatus can be applied to other applications as well such as self-cooling of gas delivery nozzles and the like.

Figure 1:
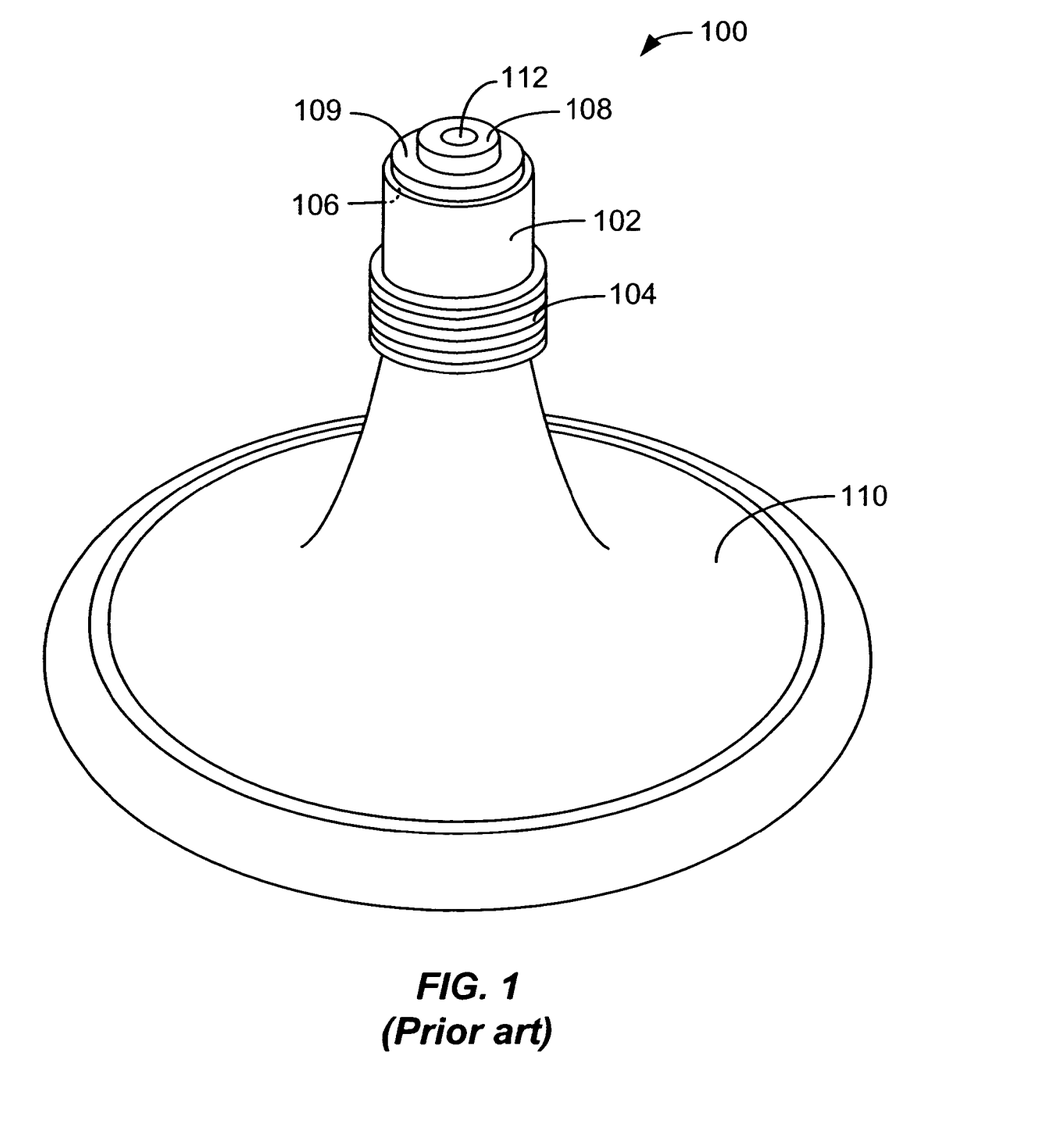
FIG. 1 is a simplified schematic illustration of a conventional gas delivery baffle.

FIG. 1 is a simplified schematic illustration of a conventional gas delivery baffle. As illustrated in FIG. 1, a conventional gas delivery baffle includes a gas inlet 112 on an upper portion of the baffle and a gas outlet on a lower face of the baffle (not shown). The baffle screws into a gas delivery apparatus using threads 104. The gas delivery apparatus (not shown) is fluidly coupled to a gas source. The baffle has a stem portion 102 adjacent to the threads 104. The stem portion includes an upper surface 106 and a raised feature 108, which provide support for an O-ring 109, which is placed on the upper surface 106 and surrounds the raised feature 108. When the baffle is attached to the gas delivery apparatus, the O-ring makes contact with a sealing surface in the gas delivery apparatus and provides a barrier to gas flow other than through gas inlet 112. The gas delivery baffle also includes a body section with a gas deflecting surface 110 that extends radially outward away from the stem section and a lower face (not shown) disposed on the opposite side of the side of the body from the gas deflecting surface.

Figure 2:
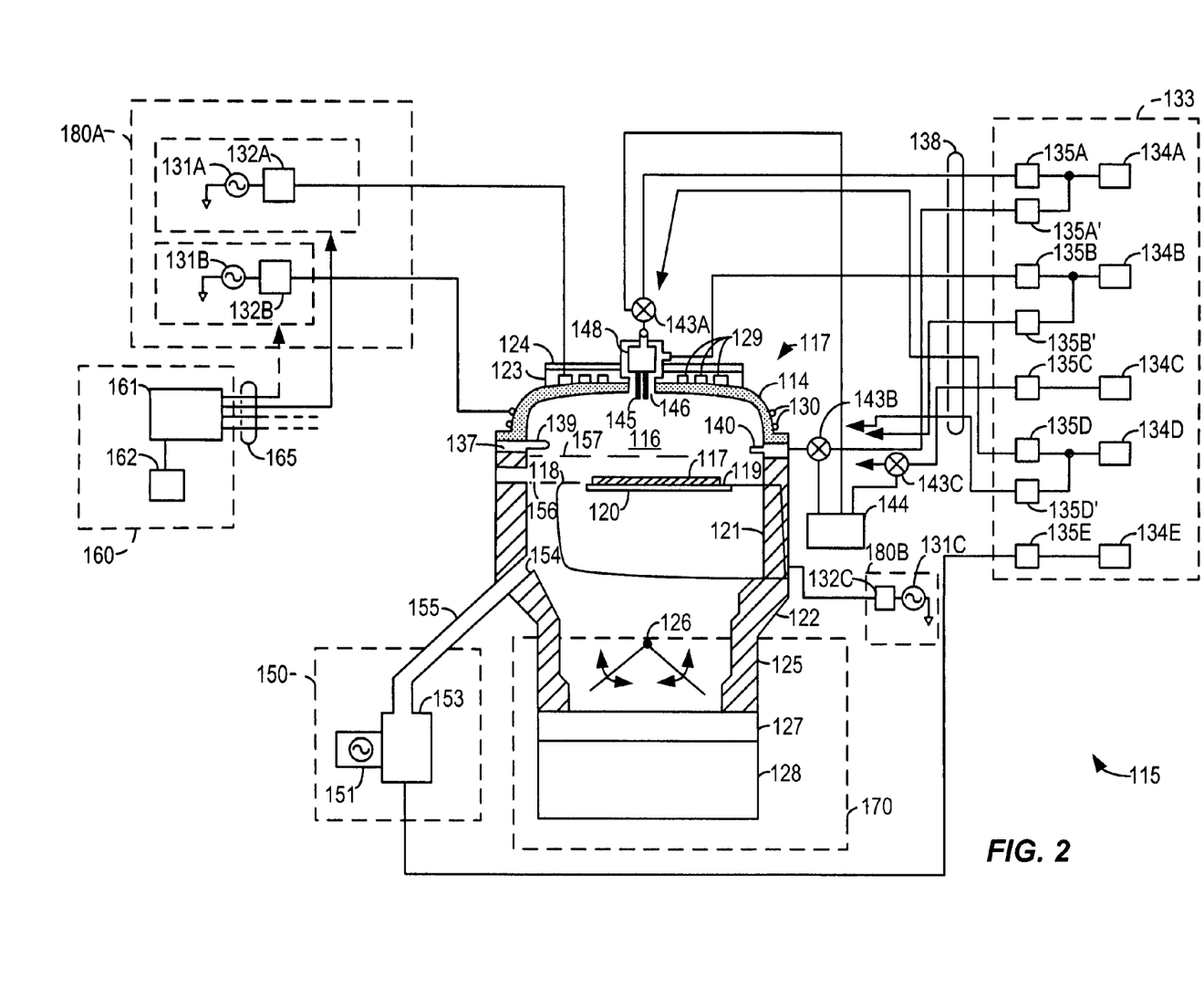
FIG. 2 is a simplified schematic illustration of a semiconductor processing chamber according to an embodiment of the present invention.

FIG. 2 is a simplified schematic illustration of a semiconductor processing chamber according to an embodiment of the present invention. The semiconductor processing chamber illustrated in FIG. 2 is one embodiment of a high density plasma chemical vapor deposition (HDP-CVD) system 115. System 115 includes a chamber 117, a substrate support 118, a gas delivery system 133, a remote plasma cleaning system 150, a vacuum system 170, a source plasma system 180A, a bias plasma system 180B. An exemplary HDP-CVD system is the Ultima X HDP-CVD Centura system manufactured by Applied Materials, the assignee of the present invention.

Embodiments of the present invention can be implemented in combination with a variety of HDP-CVD substrate processing chambers including chambers in which a plasma is formed by the application of RF energy to a coil that at least partially surrounds a portion of the chamber and chambers that use ECR plasma formation techniques. An example of an inductively-coupled HDP-CVD chamber in which embodiments of the present invention can be utilized is set forth below.

The upper portion of chamber 117 includes a dome 114, which is made of a ceramic dielectric material, such as aluminum oxide or aluminum nitride. Dome 114 defines an upper boundary of a plasma processing region 116. Plasma processing region 116 is bounded on the bottom by the upper surface of a substrate 113 and a substrate support 118, which is also made from an aluminum oxide or aluminum ceramic material.

A heater plate 123 and a cold plate 124 surmount, and are thermally coupled to, dome 114. Heater plate 123 and cold plate 124 allow control of the dome temperature to within about ±10° C. over a range of about 100° C. to 200° C. Generally, exposure to the plasma heats a substrate positioned on substrate support 118. Substrate support 118 includes inner and outer passages (not shown) that can deliver a heat transfer gas (sometimes referred to as a backside cooling gas) to the backside of the substrate.

The lower portion of chamber 117 includes a body member 122, which joins the chamber to the vacuum system. A base portion 121 of substrate support 118 is mounted on, and forms a continuous inner surface with, body member 122. Substrates are transferred into and out of chamber 117 by a robot blade (not shown) through an insertion/removal opening (not shown) in the side of chamber 117. Lift pins (not shown) are raised and then lowered under the control of a motor (also not shown) to move the substrate from the robot blade at an upper loading position 157 to a lower processing position 156 in which the substrate is placed on a substrate receiving portion 119 of substrate support 118. Substrate receiving portion 119 includes an electrostatic chuck 120 that can be used to secure the substrate to substrate support 118 during substrate processing.

Vacuum system 170 includes throttle body 125, which houses twin-blade throttle valve 126 and is attached to gate valve 127 and turbo-molecular pump 128. Gate valve 127 can isolate pump 128 from throttle body 125, and can also control chamber pressure by restricting the exhaust flow capacity when throttle valve 126 is fully open. The arrangement of the throttle valve, gate valve, and turbo-molecular pump allow accurate and stable control of chamber pressures as low as about 1 mTorr.

Source plasma system 180A is coupled to a top coil 129 and side coil 130, mounted on dome 114. A symmetrical ground shield (not shown) reduces electrical coupling between the coils. Top coil 129 is powered by top source RF (SRF) generator 131A, whereas side coil 130 is powered by side SRF generator 131B, allowing independent power levels and frequencies of operation for each coil. In a specific embodiment, the top source RF generator 131A provides up to 2,500 watts of RF power at nominally 2 MHz and the side source RF generator 131B provides up to 5,000 watts of RF power at nominally 2 MHz. The operating frequencies of the top and side RF generators may be offset from the nominal operating frequency (e.g. to 1.7-1.9 MHz and 1.9-2.1 MHz, respectively) to improve plasma-generation efficiency.

A bias plasma system 180B includes a bias RF (BRF) generator 131C and a bias matching network 132C. The bias plasma system 180B capacitively couples substrate portion 113 to body member 122, which act as complimentary electrodes. The bias plasma system 180B serves to enhance the transport of plasma species (e.g., ions) created by the source plasma system 180A to the surface of the substrate. In a specific embodiment, bias RF generator provides up to 5,000 watts of RF power at 13.56 MHz.

RF generators 131A and 131B include digitally controlled synthesizers and operate over a frequency range between about 1.8 to about 2.1 MHz. Each generator includes an RF control circuit (not shown) that measures reflected power from the chamber and coil back to the generator and adjusts the frequency of operation to obtain the lowest reflected power, as understood by a person of ordinary skill in the art. Matching networks 132A and 132B match the output impedance of generators 131A and 131B with their respective coils 129 and 130. The RF control circuit may tune both matching networks by changing the value of capacitors within the matching networks to match the generator to the load as the load changes. The RF control circuit may tune a matching network when the power reflected from the load back to the generator exceeds a certain limit. One way to provide a constant match, and effectively disable the RF control circuit from tuning the matching network, is to set the reflected power limit above any expected value of reflected power. This may help stabilize a plasma under some conditions by holding the matching network constant at its most recent condition.

A gas delivery system 133 provides gases from several sources 134(a) . . . 134(n) via gas delivery lines 138 (only some of which are shown). In the particular example illustrated, gas sources 134(a) . . . 134(n) include separate sources for $SiH_4$, $O_2$, $H_2$ and $NF_3$ as well as one or more sources for the extended cleaning process. As would be understood by a person of skill in the art, the actual sources used for sources 134(a) ... 134(n) and the actual connection of delivery lines 138 to chamber 117 varies depending on the deposition and cleaning processes executed within chamber 117. Gas flow from each source 134(a) ... 134(n) is controlled by one or more mass flow controllers (not shown) as is known to those of skill in the art. Gases are introduced into chamber 117 through a gas ring 137 and/or a top gas delivery apparatus 145.

In embodiments where flammable, toxic, or corrosive gases are used, it may be desirable to eliminate gas remaining in the gas delivery lines after a deposition or cleaning process. This may be accomplished using a 3-way valve, such as valve 143B, to isolate chamber 117 from a delivery line 138 and to vent delivery line 138 to vacuum foreline 144, for example. As shown in FIG. 7A, other similar valves, such as 143A and 143C, may be incorporated on other gas delivery lines. Such 3-way valves may be placed as close to chamber 117 and remote plasma source 150 as practical, to minimize the volume of the unvented gas delivery line (between the 3-way valve and the chamber). Additionally, two-way (on-off) valves (not shown) may be placed between a mass flow controller ("MFC") and the chamber or between a gas source and an MFC.

Chamber 117 also has top gas distributor 145 and top vent 146. Top gas distributor 145 and top vent 146 allow independent control of top and side flows of the gases, which improves film uniformity and allows fine adjustment of the film's deposition and doping parameters. Top vent 146 is an annular opening around top gas distributor 145. In one embodiment, one source, e.g., $SiH_4$, supplies source gas nozzles 139 and top gas distributor 145 through separate MFCs (not shown). Similarly, separate MFCs may be used to control the flow of oxygen to both top vent 146 and gas nozzles 140 from a single source of oxygen. The gases supplied to top gas distributor 145 and top vent 146 may be kept separate prior to flowing the gases into chamber 117, or the gases may be mixed in top plenum 148 before they flow into chamber 117. In other embodiments, separate sources of the same gas may be used to supply various portions of the chamber.

A remote plasma cleaning system 150, such as a microwave plasma source or torodial plasma source, is provided to periodically clean deposition residues from chamber components in a dry cleaning operation. The cleaning system includes a remote plasma generator 151 that creates a plasma from one or more cleaning gas source in sources 134(a) ... 134(n) (e.g., molecular fluorine, nitrogen trifluoride, other perfluorocompound or equivalents alone or in combination with another gas such as argon) in reactor cavity 153. The reactive species resulting from this plasma are conveyed to chamber 117 through cleaning gas feed port 154 via applicator tube 155. The materials used to contain the cleaning plasma (e.g., cavity 153 and applicator tube 155) must be resistant to attack by the plasma. The distance between reactor cavity 153 and feed port 154 should be kept as short as practical, since the concentration of desirable plasma species may decline with distance from reactor cavity 153. Generating the cleaning plasma in a remote cavity does not subject chamber components to the temperature, radiation, or bombardment of the glow discharge that may be present in a plasma formed in situ. Consequently, relatively sensitive components, such as electrostatic chuck 120, do not need to be covered with a dummy wafer or otherwise protected, as may be required with an in situ plasma cleaning process.

System controller 160 controls the operation of system 115. Controller 160 may include, for example, a memory 162, such as a hard disk drive and/or a floppy disk drive and a card rack coupled to a processor 161. The card rack may contain a single-board computer (SBC), analog and digital input/output boards, interface boards and stepper motor controller boards. System controller 160 operates under the control of a computer program stored on the hard disk drive or through other computer programs, such as programs stored on a removable disk. The computer program dictates, for example, the timing, mixture of gases, RF power levels and other parameters of a particular process.

In some embodiments of the present invention, the semiconductor processing chamber is operated at reduced pressure. For example, HDP-CVD systems generally operate at lower pressure ranges than low density plasma systems. The low chamber pressure employed in HDP-CVD systems provides active species having a long mean-free-path and reduced angular distribution. These factors, in combination with the plasma's density, contribute to a significant number of constituents from the plasma reaching even the deepest portions of closely spaced gaps, providing a film with improved gap-fill capabilities as compared to films deposited in a low density plasma CVD system. Accordingly, the gas pressure in the gas delivery system generally exceeds the gas pressure in the processing chamber.

Figure 3:
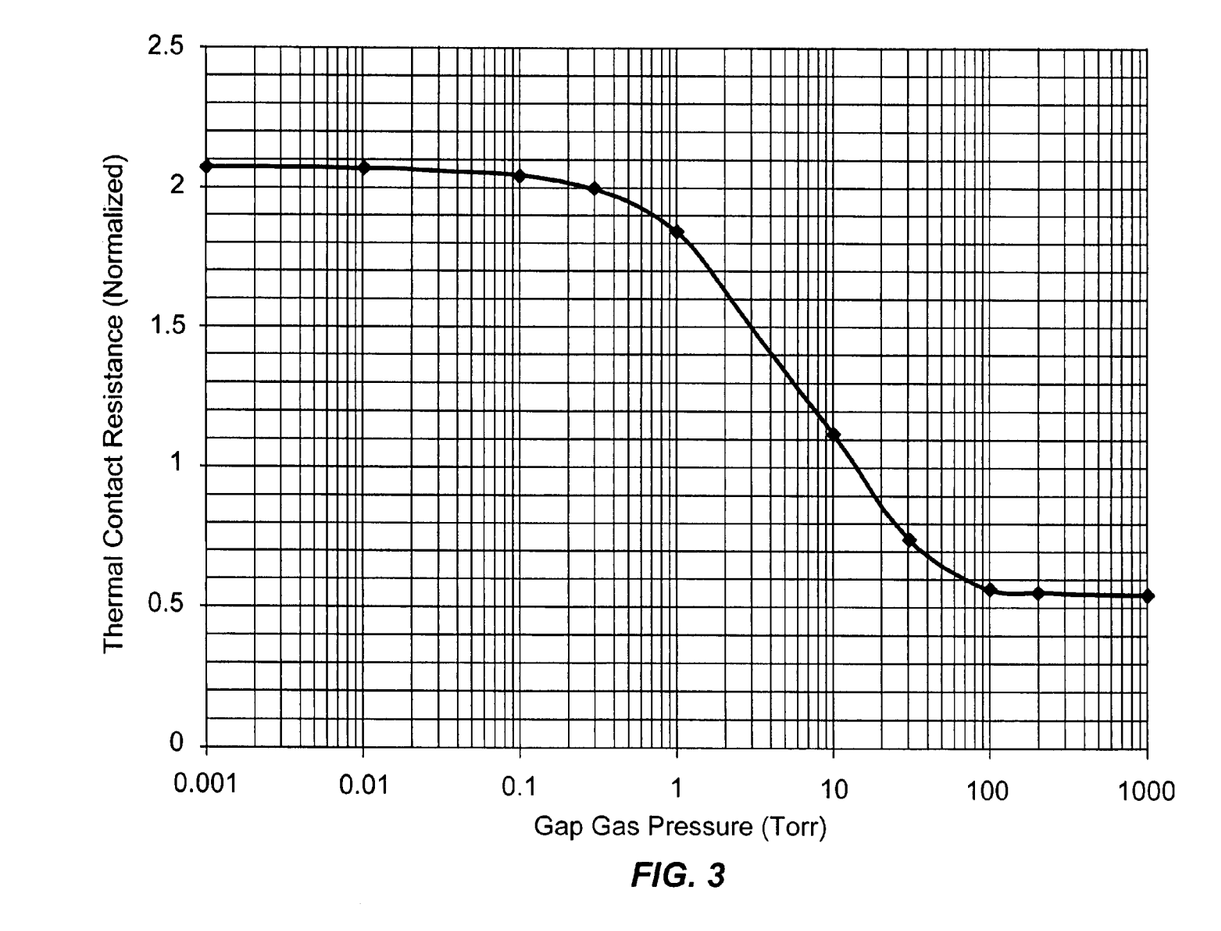
FIG. 3 is graph of thermal contact resistance v. gap gas pressure.

FIG. 3 is graph of thermal contact resistance v. gap gas pressure for conducting heat across a gap filled with gas molecules. As illustrated in FIG. 3, the ability of a gas to conduct heat across a gap is a function of the gas pressure present in the gap. This chart quantifies the pressure-dependence of thermal conductivity through gas molecules across a gap filled with gas molecules. At high pressures, for example, 100 Torr, the normalized thermal contact resistance is approximately 0.57. As the pressure of the gas in the gap decreases, the thermal contact resistance increases, for example to a normalized value of 2.05 at a pressure of 0.1 Torr. As the density of gas molecules in the gap decreases, the mean-free path of the molecules decreases, resulting in an increase in contact resistance.

During operation of the HDP-CVD chamber, the presence of the plasma in the chamber generally heats, not only the substrate, but chamber components as well. In particular, the temperature of the gas delivery baffle generally increases to a high level during chamber operation. Two byproducts of the increase in temperature of the gas delivery baffle are the possible introduction of particles into the chamber and the reduction of gas flow uniformity in the chamber. Both of these effects will adversely impact film quality. Thus, in one embodiment of the present invention, it is preferable to reduce the temperature of the gas delivery baffle during chamber operation.

Referring to the gas delivery baffle illustrated in FIG. 1, the upper portion 106 of the stem 102 supports the O-ring 109. The O-ring provides for a seal between the gas delivery system and the processing chamber as gas is delivered through gas inlet 112. In some HDP-CVD systems, the gas pressure in the gas delivery lines 138 leading to the gas delivery baffle is about 5 Torr. In contrast, the pressure inside the processing chamber is much lower. Of course, the chamber pressure varies with the application, but in some deposition applications the chamber pressure is about 5 mTorr. Referring to FIG. 3, the thermal contact resistance for a given gap increases from about 1.35 to about 2.07 as the gas pressure is decreased from 5 Torr to 5 mTorr, an increase of over 50%.

As illustrated in FIG. 1, the gas present in the gas delivery system makes contact with the gas delivery baffle at the raised feature 108 and the top of the O-ring 109. These surfaces provide a limited surface area for the transfer of heat from the gass delivery baffle to the gases present in the delivery system. Thus, the gases present in the delivery system, although at higher pressure, and therefore, possessing greater ability to conduct heat than the gases in the chamber, have limited ability to provide for cooling of the gas delivery baffle.

Figure 4:
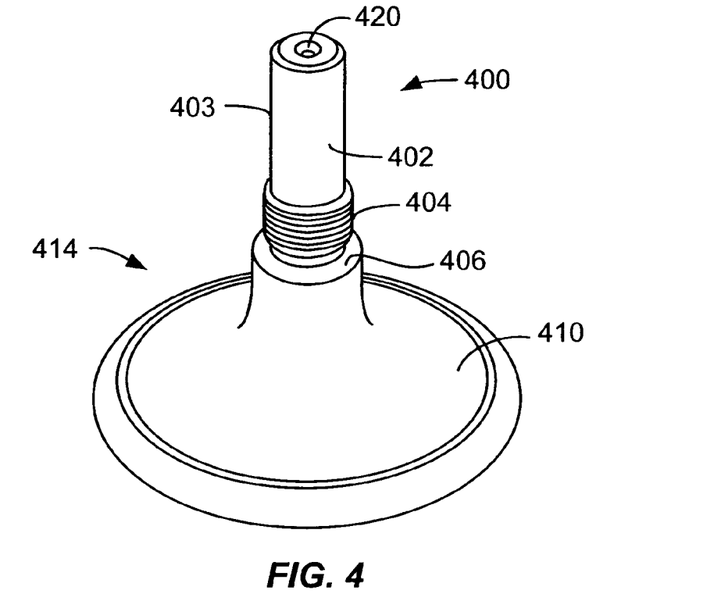
FIG. 4 is a simplified schematic illustration of a gas distributor according to one embodiment of the present invention.

FIG. 4 is a simplified schematic illustration of a gas distributor according to one embodiment of the present invention. As illustrated in FIG. 4, the gas distributor 400 includes a gas inlet 420 on an upper portion of the distributor and a gas outlet on a lower face of the distributor (not shown). A gas delivery apparatus (not shown) is fluidly coupled to a source of process gases. The distributor has a stem portion 402 including spiral threads 404. The distributor screws into the gas delivery apparatus using threads 404. The distributor also includes a body having a gas deflecting surface 410 that extends radially outward away from the stem section and a lower face (not shown) disposed on the opposite side of the body from the gas deflecting surface. A gas passageway extends from the gas inlet 420 through the stem section and the body to the gas outlet (not shown) on the lower face of the body. A lateral seat 406 is disposed between the spiral threads 404 and the gas deflecting surface 410.

Figure 5:
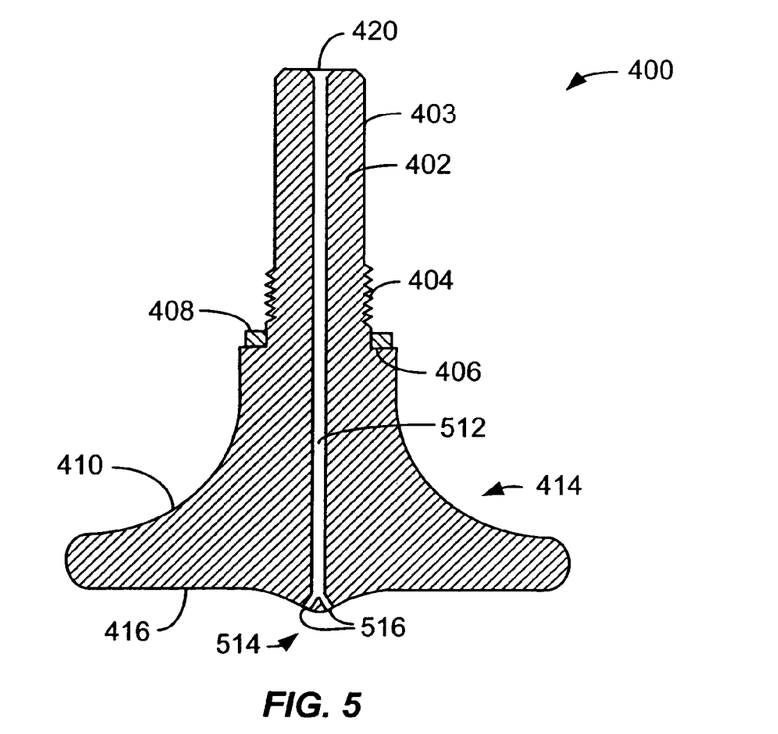
FIG. 5 is a cross-sectional view of a simplified schematic illustration of a gas distributor according to one embodiment of the present invention.

In one embodiment according to the present invention, the lateral seat 406 is adapted to hold a sealing member. In a particular embodiment, the sealing member is an O-ring. FIG. 5 is a cross-sectional view of a simplified schematic illustration of a gas distributor 400 according to one embodiment of the present invention. This figure provides an alternative illustration of the gas distributor, including gas inlet 420, stem section 402, and spiral threads 404. Body 414 includes gas deflecting surface 410 and lower face 416. Gas passageway 512 runs from gas inlet 420 to gas outlet 514. As illustrated in FIG. 5, gas outlet 514, present on the lower face of the gas distributor, comprises a number of gas outlet ports 516. In one embodiment, there are three gas outlet ports 516 present on the lower face, each of the outlets arranged at angle of 120° to the other two outlets. However, this is not required by the present invention. Alternative embodiments utilize different numbers of outlet ports with different geometrical arrangements as appropriate for a given application. As illustrated in FIG. 5, sealing member 408 is supported by lateral seat 406 between spiral threads 404 and gas deflecting surface 410.

Figure 6:
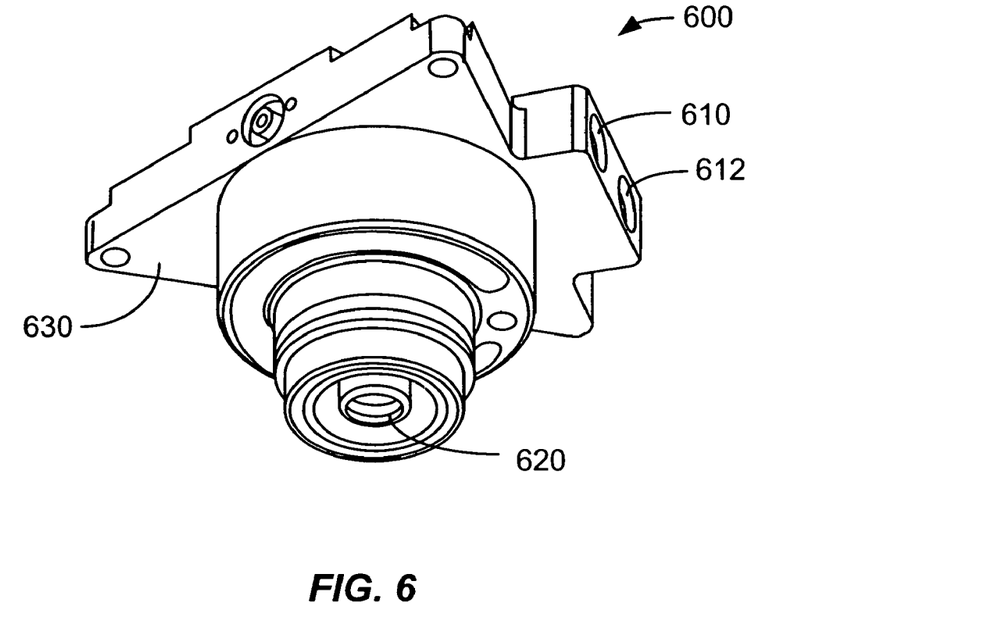
FIG. 6 is a simplified schematic illustration of a gas delivery block according to an embodiment of the present invention.

FIG. 6 is a simplified schematic illustration of a gas delivery block according to an embodiment of the present invention. The gas delivery block 600 includes gas delivery orifice 620 and mounting flange 630. The mounting flange attaches to an upper surface of the semiconductor processing chamber. Cooling water is provided to the gas delivery block by cooling water intake port 610 and exits the gas delivery block via cooling water discharge port 612. Heat generated in the chamber and transferred to the block is removed by the cooling water, maintaining the gas delivery block at a predetermined temperature.

Figure 7:
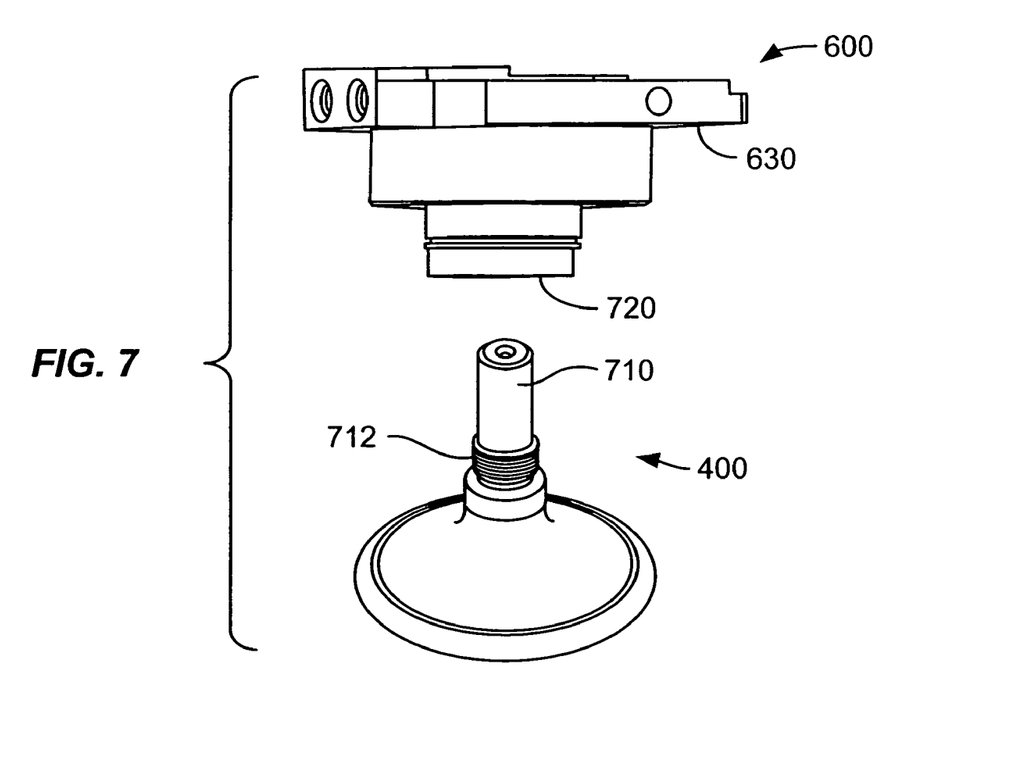
FIG. 7 is a simplified schematic illustration showing a perspective view of the alignment of a gas distributor prior to a gas delivery block prior to insertion according to one embodiment of the present invention.

FIG. 7 is a simplified schematic illustration showing a perspective view of the alignment of a gas distributor prior to a gas delivery block prior to insertion according to one embodiment of the present invention. Gas distributor 400 is inserted into the gas delivery block 600 by inserting the stem section 710 of the gas distributor into the gas delivery orifice 720 of the gas delivery block. Spiral threads 712 are screwed into mating threads (not shown) present in the gas delivery block. In one embodiment of the present invention, the mounting flange 630 makes contact with the dome of the processing chamber, while the gas distributor is located inside the chamber.

Figure 8:
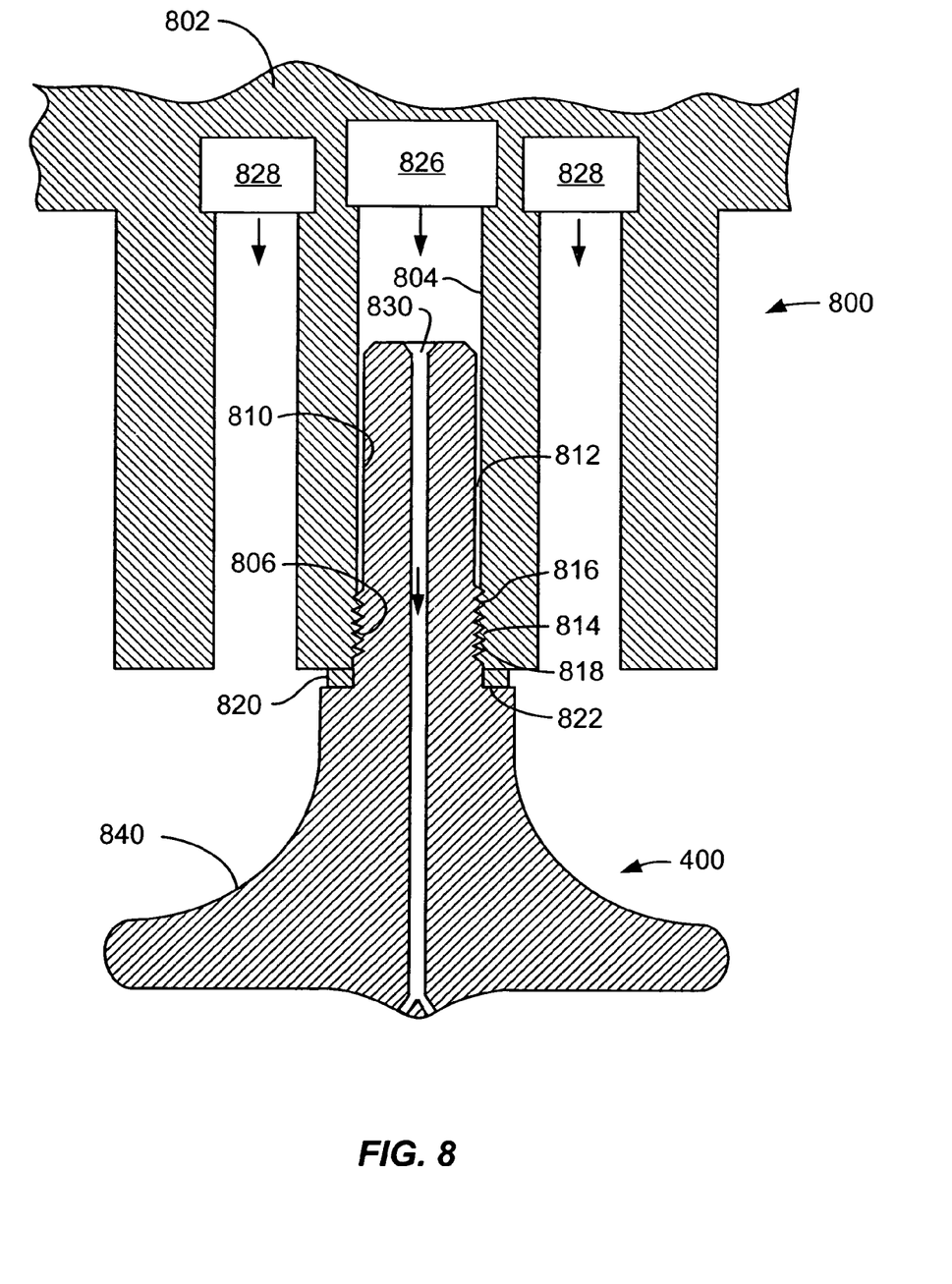
FIG. 8 is a simplified schematic cross-sectional view showing a gas distributor coupled to a gas delivery block according to one embodiment of the present invention.

FIG. 8 is a simplified schematic cross-sectional view showing a gas distributor coupled to a gas delivery block according to one embodiment of the present invention. Gas distributor 400 is coupled to the gas delivery block 800 by threads 816. The stem section of the gas distributor is inserted into gas delivery orifice so that outer surfaces 810 of the stem section are surrounded by inner surfaces 804 of the gas delivery orifice. Threads 816 present on the gas distributor are coupled to corresponding threads 806 present on the gas delivery block. As illustrated in FIG. 8, O-ring 820 provides a seal between the lateral seat 822 and the gas delivery block. Process gases flow from gas source 826 to the gas inlet 830 and are able to pass into the gap 812 between the gas distributor and the gas delivery block, as well as the gap 818 between the threads on the gas distributor and the threads on the gas delivery block. The gap 812 has a predetermined thickness. In an embodiment according to the present invention, the gap 812 is about 20 mils (0.020 inches). Alternatively, the thickness ranges from about 10 mils to about 30 mils in other embodiments. Moreover, the gap 818 has a predetermined thickness. In one embodiment, the gap 818 is about 10 mils (0.010 inches). Alternatively, the thickness ranges from about 5 mils to about 20 mils in other embodiments. Of course, the thickness of the gaps 812 and 818 will depend upon the particular applications.

In a specific embodiment, the gap 812 is minimized to decrease the distance between the outer surface of the stem 810 and the inner surface of the gas delivery block 804 while still allowing a gap large enough to facilitate insertion of the gas distributor into the gas delivery block. In some embodiments, a reduced gap thickness promotes heat transfer between the gas distributor and the gas delivery block via heat conduction through the process gases present in the gap.

The stem section has a predetermined length. In an embodiment according to the present invention, the length of the stem is 0.500 inches. Alternatively, the length ranges from about 0.200 inches to about 2.0 inches in other embodiments. Of course, the length of the stem will depend upon the particular application. In some embodiments, the length of the stem section is selected to increase the surface area of the stem and, as a result, the thermal contact between the stem and the process gases present in the gap between the stem and the inner surface of the gas delivery block.

The position of the lateral seat 822 between the spiral thread 816 and the gas deflecting surface 840 allows the process gases to pass through the gap 812 between the outer surface 810 of the stem section and the inner surface 804 of the gas delivery block. In embodiments in which a sealing member 822. for example, an O-ring, is supported by the lateral seat, the process gases pass to the top of the sealing member. Because, in some embodiments, the pressure of the process gas is about 5 Torr, the thermal conductivity of the gas present in the gap 812 allows for transfer of heat from the gas distributor to the gas delivery block. Thus, heat produced in the chamber, resulting from plasma heating or other sources, and absorbed by the gas distributor is conducted through the gap and into the gas delivery block.

As previously discussed in relation to FIG. 6, the gas delivery block in one embodiment includes a cooling water intake port as well as a cooling water discharge port. The use of cooling water enables the gas delivery block to be maintained at a predetermined temperature. Thus, heat absorbed by the gas distributor and transferred to the gas delivery block is carried away as it is finally transferred to the cooling water. Provision of cooling water, along with appropriate water inlet/outlet temperatures and flow rates will be apparent to one of skill in the art, depending on the operating parameters selected for the semiconductor processing chamber.

Figure 9:
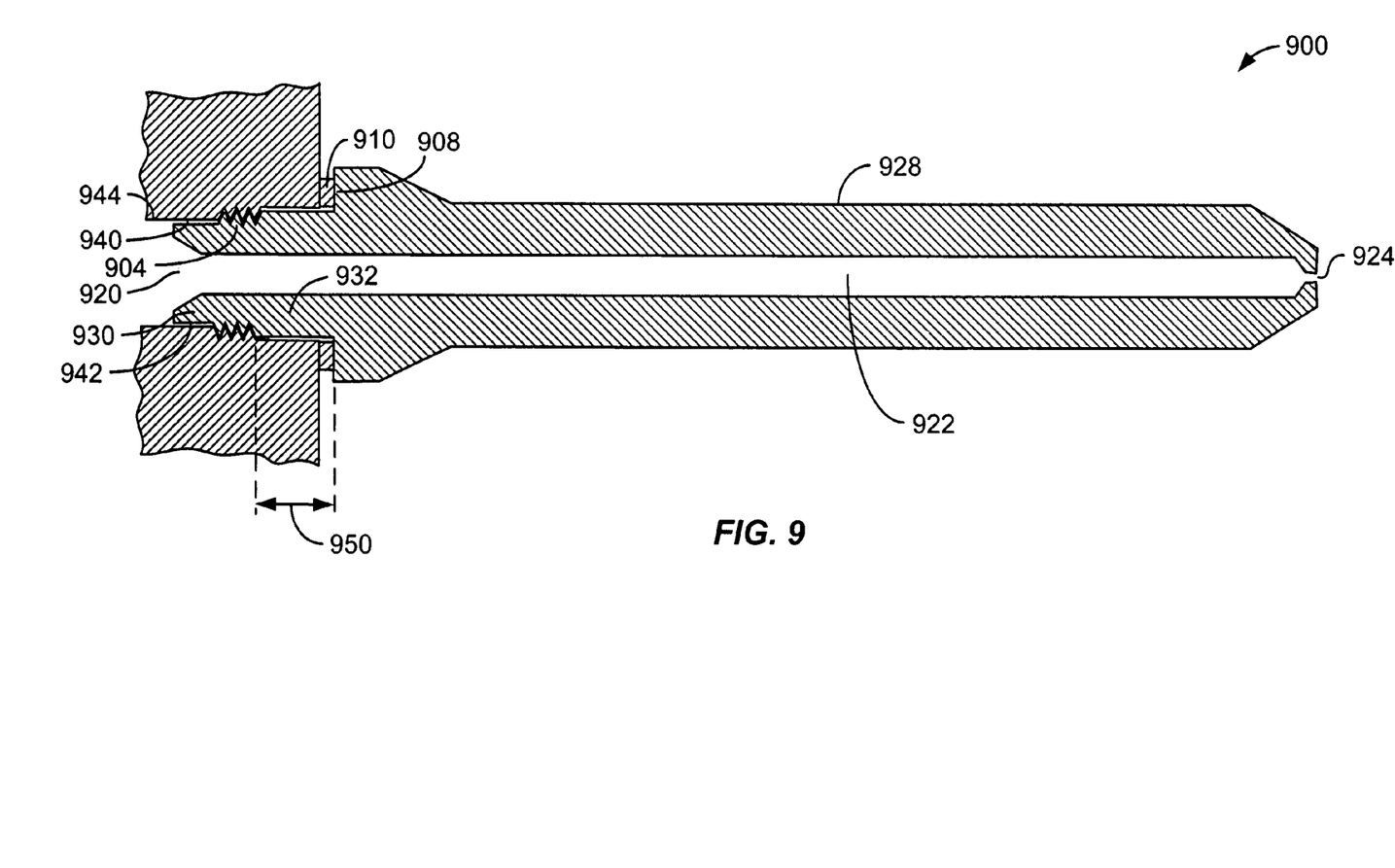
FIG. 9 is a simplified schematic cross-sectional view of a gas nozzle according to an embodiment of the present invention.

Although embodiments in accordance with the present invention have utilized gas distributors mounted in an upper surface of the chamber dome, this is not required by the present invention. Gas distributors with different geometries and/or chamber locations are utilized in alternative embodiments of the present invention. For example, FIG. 9 is a simplified schematic cross-sectional view of a gas nozzle according to an embodiment of the present invention. Gas nozzles are used for introducing gas into a variety of CVD systems, including gas delivery nozzle 139 disposed on the sides of a HDP-CVD chamber as illustrated in FIG. 2.

The gas nozzle illustrated in FIG. 9 includes a proximal portion and a distal portion, the proximal portion connected to a chamber wall of a semiconductor processing chamber and the distal portion oriented inwardly away from the chamber wall into an interior of the semiconductor processing chamber. As illustrated in FIG. 9, a proximal end 920 of the gas nozzle is configured to be coupled with a gas supply to provide process gases to the chamber. Moreover, the gas nozzle includes a stem section 930 adjacent to the proximal end and a spiral thread section 904 adjacent to the stem section. As discussed in relation to the gas distributor above, the stem section of the gas nozzle will fit into a recessed portion of the chamber wall, forming a gap 940 of predetermined thickness between the outer surface 942 of the stem section and the inner surface 944 of the recess in the chamber wall. Process gases flow from the gas distribution system coupled to the chamber wall to the proximal end 920 of the gas nozzle and are able to pass into the gap 940 between the outer surface of the stem section and the inner surface of the recess in the chamber wall. The gap 940 has a predetermined thickness. In an embodiment according to the present invention, the gap 940 is about 20 mils (0.020 inches). Alternatively, the thickness ranges from about 10 mils to about 30 mils in other embodiments. Of course, the thickness of the gap 940 will depend upon the particular applications.

A gas passage 922 extends from the proximal end 920 to the distal end 924, which includes a nozzle opening for flow of gas into the chamber. A nozzle body 928 extends a predetermined distance from the distal end and comprises a portion of the gas passage 922. In one embodiment, the length of the nozzle body is about 2.5 inches. Alternatively, the length ranges from about 0.5 inches to about 5.0 inches in other embodiments. Of course, the length will depend upon the particular applications.

The gas nozzle also includes a lateral seat 908 disposed between the spiral thread section and the nozzle body. In one embodiment, a sealing member 910 is disposed to make contact with the lateral seat and the chamber wall of the semiconductor processing chamber. In a specific embodiment, the sealing member is an O-ring. In some embodiments, the O-ring is made from a material with predetermined thermal and mechanical properties. For example, the O-ring may be made from a variety of materials, including aluminum or a fluoropolymer resin. In one embodiment, the thickness of the O-ring is about 0.050 inches. Alternatively, the thickness ranges from about 0.020 inches to about 0.200 inches. Of course, the thickness will depend upon the particular applications.

The process gases provided via the gas delivery apparatus coupled to the chamber wall pass from the proximal portion of the gas nozzle through the gas passage are allowed to pass through a gap 940 between the stem section and the chamber wall. In one embodiment, because the process gases are at about 5 Torr, the process gases provide a thermal conduction path across the gap between gas nozzle and the chamber wall, resulting in cooling of the gas nozzle. In some embodiments, the sealing member forms a barrier to the flow of process gases at the distal end of the gap. In embodiments in which the sealing member is separated from one end of the threads 904 by a distance 950, an additional stem section 932 provides additional surface area for transfer of heat from the gas nozzle to the chamber wall. In this particular embodiment, the process gases surround the stem section 930, the threads 904, and the stem section 932. The contact between the chamber wall, the sealing member 910 and the lateral seat 908 provides a barrier to the flow of process gases while still allowing for cooling of the gas nozzle via conduction through the gap 940.

While the invention has been described in detail and with reference to specific examples thereof, it will be apparent to one skilled in the art that various changes and modifications can be made therein without departing from the spirit and scope thereof. These equivalents and alternatives are intended to be included within the scope of the present invention.

What is claimed is:

1. A gas distributor for use in a semiconductor processing chamber, the gas distributor comprising:
   a gas inlet;
   a gas outlet;
   a first cylindrical stem section extending from the gas inlet to a spiral thread section, the first cylindrical stem section being characterized by a first diameter and the spiral thread section being characterized by an inner diameter and an outer diameter, the outer diameter being greater than the inner diameter and the first diameter;
   a body having a gas deflecting surface that extends radially outward and a lower face disposed on an opposite side of the body from the gas deflecting surface;
   a second cylindrical stem section extending from the spiral thread section to a lateral seat, the lateral seat disposed between the second cylindrical stem section and the gas deflecting surface, wherein the lateral seat is adjacent to the gas deflecting surface and wherein a periphery of the lateral seat is characterized by a third diameter greater than the outer diameter; and
   a gas passageway that extends from the gas inlet through the first cylindrical stem section, the spiral thread section, the second cylindrical stem section, and the body to the gas outlet.

2. The gas distributor of claim 1 wherein the first cylindrical stem section has a length of between 0.2 and 2.0 inches.

3. The gas distributor of claim 1 wherein the lateral seat is adapted to hold a sealing member.

4. The gas distributor of claim 3 wherein the sealing member is an O-ring.

5. The gas distributor of claim 4 wherein the O-ring is fabricated from a material selected from the group consisting of aluminum and fluoropolymer resin.

6. The gas distributor of claim 1 wherein the gas distributor is alumina.

7. A substrate processing system, the system comprising:
   a processing chamber having an interior upper surface that includes a centered circular opening;
   a substrate support member disposed in the processing chamber;
   a gas distributor that extends through the circular opening in the upper surface of the chamber towards the substrate support member, the gas distributor comprising a gas inlet, a gas outlet, a first cylindrical stem section extending from the gas inlet to a spiral thread section, the first cylindrical stem section being characterized by a first diameter and the spiral thread section being characterized by an inner diameter and an outer diameter, the outer diameter being greater than the inner diameter and the first diameter, a body having a gas deflecting surface that extends radially outward and a lower face disposed on an opposite side of the body from the gas deflecting surface, a second cylindrical stem section extending from the spiral thread section to a lateral seat, the lateral seat disposed between the second cylindrical stem section and the gas deflecting surface, wherein the lateral seat is adjacent to the gas deflecting surface and wherein a periphery of the lateral seat is characterized by a third diameter greater than the outer diameter, and a gas passageway that extends from the gas inlet through the first cylindrical stem section, the spiral thread section, the second cylindrical stem section, and the body to the gas outlet; and a gas exit circumscribing the gas distributor.

8. The apparatus of claim 7 further comprising a gas delivery block overlying the centered circular opening of the upper surface of the chamber, the gas delivery block comprising a spiral thread that is threadably coupled to the spiral thread section of the gas distributor.

9. The apparatus of claim 8 wherein the gas delivery block further comprises one gas passage that is in fluid communication with the gas inlet of the gas distributor and a second gas passage that is in fluid communication with the gas exit circumscribing the gas distributor.

10. The apparatus of claim 9 wherein the gas delivery block is coupled to a source of cooling water.

11. The apparatus of claim 9 wherein a first pressure exists in the gas passage that is in fluid communication with the gas inlet of the gas distributor and a second pressure exists in an interior portion of the processing chamber.

12. The apparatus of claim 11 wherein the first pressure is greater than the second pressure.

13. The apparatus of claim 12 wherein the first pressure is about 5 Torr and the second pressure is about 5 mTorr.

14. The apparatus of claim 7 wherein the processing chamber is a high density plasma chamber.

15. The apparatus of claim 7 wherein the lateral seat is adapted to hold a sealing member.

16. The apparatus of claim 15 wherein the sealing member is an O-ring.

17. The apparatus of claim 16 wherein the O-ring is fabricated from a material selected from the group consisting of aluminum and fluoropolymer resin.

* * * * *